United States Patent
Witte et al.

(10) Patent No.: US 8,900,972 B2
(45) Date of Patent: Dec. 2, 2014

(54) SYSTEMS AND METHODS FOR PRODUCING SEED BRICKS

(71) Applicant: MEMC Singapore, Pte. Ltd, Singapore (SG)

(72) Inventors: Dale A. Witte, Wentzville, MO (US); Jihong John Chen, St. Charles, MO (US); Travis L. Hambach, Warrenton, MO (US); Linda K. Swiney, St. Charles, MO (US)

(73) Assignee: MEMC Singapore Pte. Ltd., Singapore (SG)

( * ) Notice: Subject to any disclaimer, the term of this patent is extended or adjusted under 35 U.S.C. 154(b) by 14 days.

(21) Appl. No.: 13/680,873

(22) Filed: Nov. 19, 2012

(65) Prior Publication Data

US 2014/0137395 A1    May 22, 2014

(51) Int. Cl.
| | |
|---|---|
| H01L 21/00 | (2006.01) |
| C30B 33/00 | (2006.01) |
| C30B 35/00 | (2006.01) |
| B28D 5/04 | (2006.01) |
| B23D 1/00 | (2006.01) |
| C30B 33/06 | (2006.01) |

(52) U.S. Cl.
CPC .. B23D 1/00 (2013.01); B28D 5/04 (2013.01); C30B 35/00 (2013.01); C30B 33/06 (2013.01)
USPC .......................... 438/464; 117/204

(58) Field of Classification Search
USPC .......................... 117/204; 438/464
See application file for complete search history.

(56) References Cited

U.S. PATENT DOCUMENTS

| | | | | |
|---|---|---|---|---|
| 4,075,055 | A * | 2/1978 | Ciszek et al. | 117/26 |
| 4,125,425 | A * | 11/1978 | Brissot | 117/26 |
| 5,264,070 | A * | 11/1993 | Urquhart et al. | 117/97 |
| 7,993,453 | B2 | 8/2011 | Oyanagi et al. | |
| 8,430,958 | B2 * | 4/2013 | D'Evelyn | 117/68 |
| 8,440,157 | B2 * | 5/2013 | Stoddard et al. | 423/349 |
| 8,591,851 | B2 * | 11/2013 | Stoddard et al. | 423/348 |
| 2007/0169685 | A1 | 7/2007 | Stoddard | |
| 2008/0182092 | A1 | 7/2008 | Bondokov et al. | |
| 2010/0126489 | A1 | 5/2010 | Bakshi et al. | |

FOREIGN PATENT DOCUMENTS

| | | |
|---|---|---|
| DE | 19739966 A1 | 3/1999 |
| JP | 2003095790 A | 4/2003 |
| JP | 2004292286 A | 10/2004 |
| KR | 2010093892 A | 8/2010 |
| WO | 2008015895 A1 | 2/2008 |

(Continued)

OTHER PUBLICATIONS

Applied HCT™ Wafering Systems, Brochure, Oct. 2012, pp. 9; Applied Materials Inc.

(Continued)

Primary Examiner — Evan Pert
(74) Attorney, Agent, or Firm — Armstrong Teasdale LLP

(57) ABSTRACT

A method of producing rectangular seed bricks for use in semiconductor or solar manufacturing is disclosed. The method includes connecting an alignment layer to a top surface of a template, drawing alignment lines on the alignment layer to demarcate a plurality of nodes, connecting cylindrical rods to the alignment layer such that a center of each rod is aligned with a corresponding node, and slicing through the rods and the alignment layer with a wire web to produce rectangular seed bricks.

18 Claims, 12 Drawing Sheets

(56) References Cited

FOREIGN PATENT DOCUMENTS

| WO | 2010078205 A1 | 7/2010 |
|---|---|---|
| WO | 2011002242 A2 | 1/2011 |
| WO | 2011032599 A1 | 3/2011 |

OTHER PUBLICATIONS

Wafer Slicing Technology for Solar Photovoltaic Cells, Brochure, Apr. 2011, pp. 6, Applied Materials, Inc.

Advanced Wire Sawing Technology for Solar Photovoltaic Cells, Brochure, Apr. 2011, pp. 8, Applied Materials, Inc.

Wafer Wire Sawing Economics and Total Cost of Ownership Optimization, Brochure, Apr. 2011, pp. 10, Applied Materials, Inc.

BrickMaster BM860, Fact Sheet, pp. 2, Meyer Burger AG, www.meyerburger.ch.

International Search Report and Written Opinion of the International Searching Authority regarding PCT/US2013/070680 dated Feb. 11, 2014, pp. 14.

International Search Report and Written Opinion of the International Searching Authority regarding PCT/US2013/070503 dated Jan. 30, 2014, pp. 11.

\* cited by examiner

SYSTEMS AND METHODS FOR PRODUCING SEED BRICKS

FIELD

This disclosure generally relates to seed bricks for use in manufacturing semiconductor or solar wafers, and more specifically, to producing seed bricks.

BACKGROUND

Silicon seed bricks are the starting material in many processes for fabricating semiconductor electronic components and solar materials. For example, a silicon seed brick may be split into multiple seed crystals. To produce semiconductor or solar wafers, and in particular high efficiency solar wafers, a silicon ingot may be produced by melting polycrystalline silicon in a crucible of a directional solidification system (DSS) furnace from the top down to the seeds at the bottom of the crucible. Directional solidification generally maintains the seed crystalline structure throughout the produced ingot. The silicon ingot is then machined into wafers, which can be used in a variety of electronic or solar components.

In some applications, cutting individual seed bricks from a cylindrical rod may be time-consuming. Further, using a band saw to cut seed bricks may result in a poor surface finish on the resulting seed bricks, and may cause irregular and/or misshapen mating surfaces on the resulting seed bricks.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect is a method of producing rectangular seed bricks for use in semiconductor or solar manufacturing. The method includes connecting an alignment layer to a top surface of a template, the template including a grid of horizontal and vertical slots, and drawing alignment lines on the alignment layer to demarcate a plurality of nodes. The method further includes connecting cylindrical rods to the alignment layer such that a center of each rod is aligned with a corresponding node, and slicing through the rods and the alignment layer with a wire web to produce the rectangular seed bricks.

Another aspect is an apparatus for producing rectangular seed bricks for use in semiconductor or solar manufacturing. The apparatus includes a template having a top surface and a grid of horizontal and vertical slots, and an alignment layer connected to the top surface of the template. The alignment layer includes alignment lines demarcating a plurality of nodes, and cylindrical rods made of a semiconductor material and connected to the alignment layer. A center of each rod is aligned with a corresponding node, and a wire web configured to slice through the rods and the alignment layer to produce the rectangular seed bricks.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
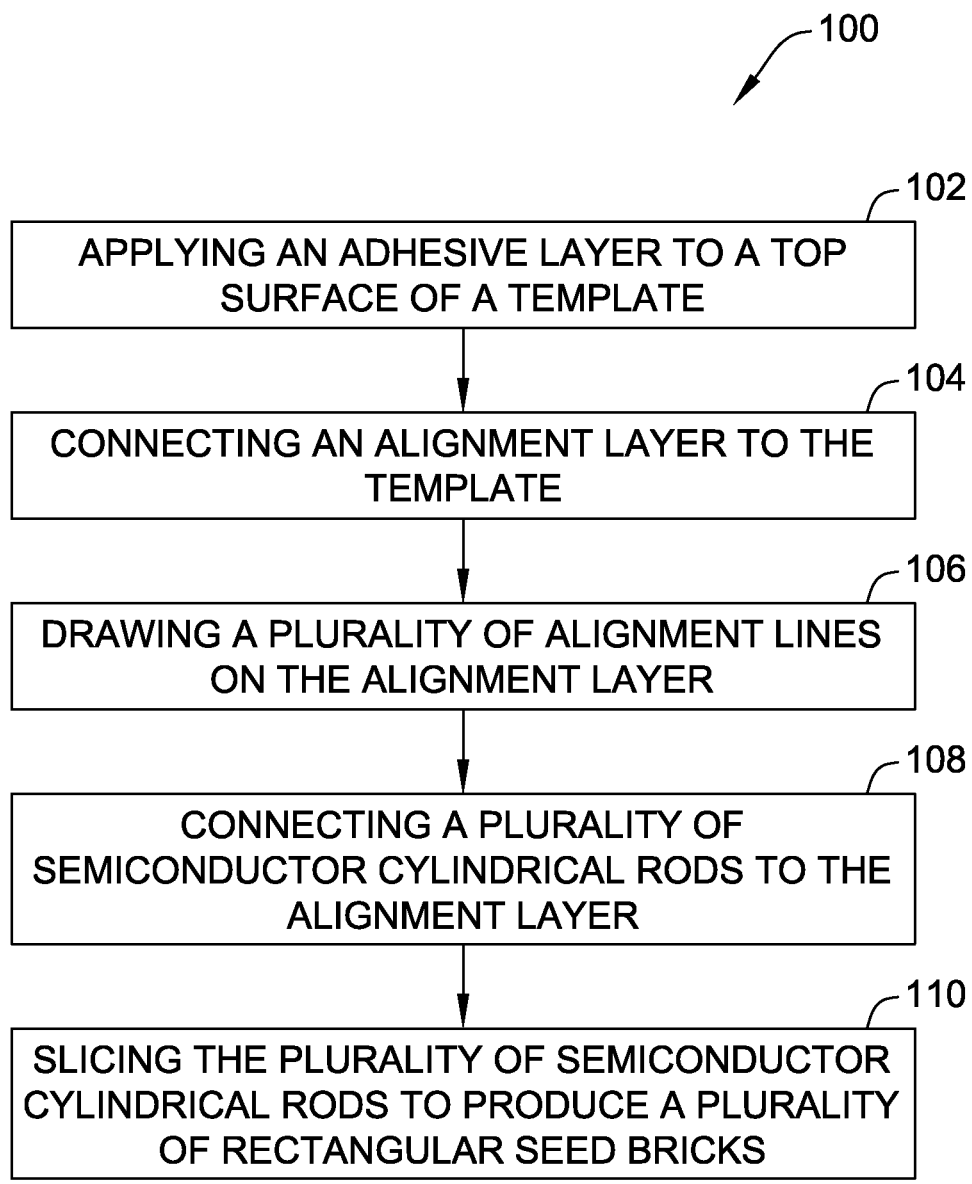
FIG. 1 is a flowchart of a method for use in producing a plurality of seed bricks.

Referring initially to FIG. 1, a method for producing seed bricks is indicated generally at 100. Seed bricks produced using method 100 may be used to produce semiconductor or solar wafers, including high-efficiency solar wafers, as described herein.

The method 100 generally includes a step 102 of applying an adhesive layer to a top surface of a template, a step 104 of connecting an alignment layer to the template, a step 106 of drawing a plurality of alignment lines on the alignment layer, a step 108 of connecting a plurality of cylindrical rods to the alignment layer, and a step 110 of slicing the plurality of cylindrical rods to produce a plurality of rectangular seed bricks.

Figure 2:
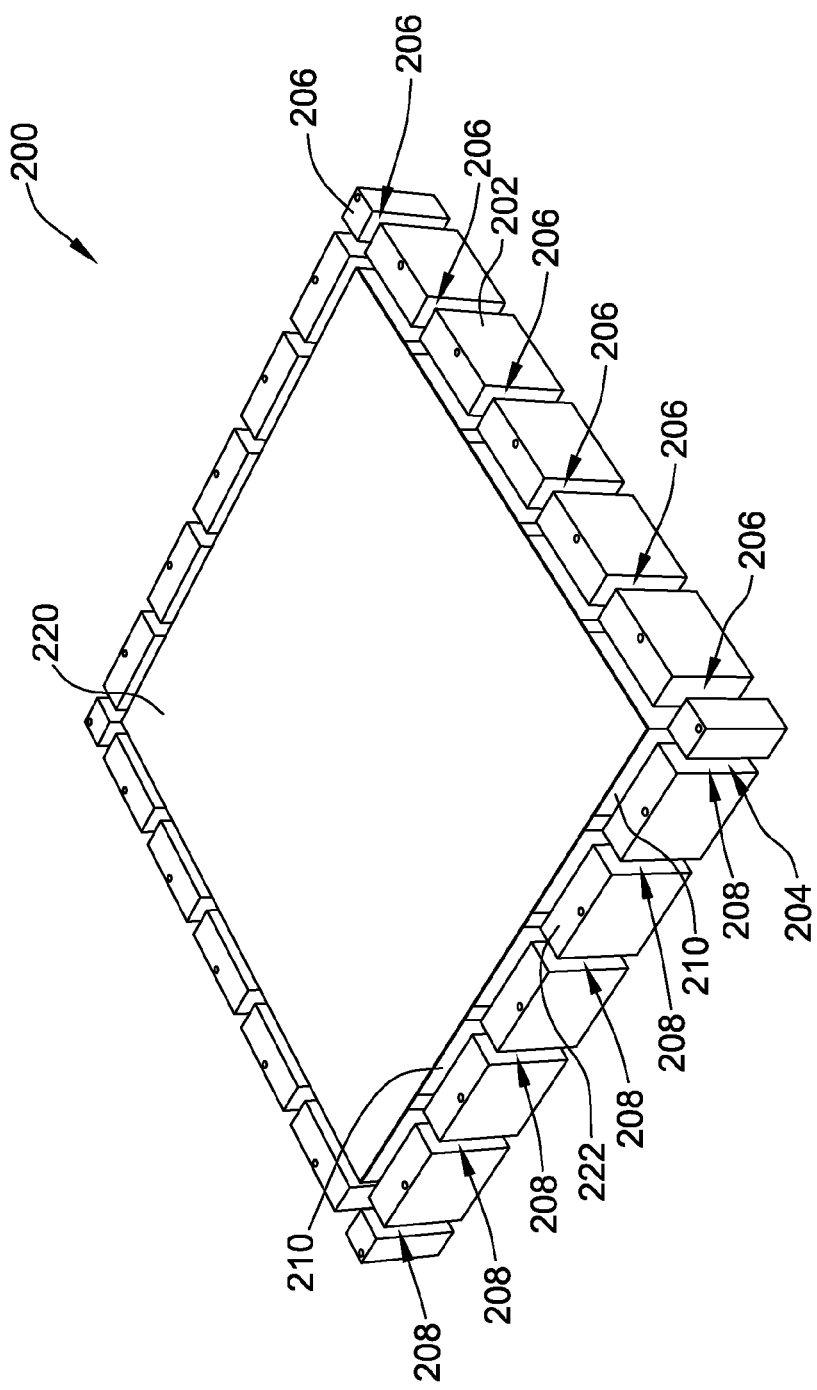
FIG. 2 is a perspective view of an apparatus of one embodiment for producing seed bricks.

Referring to FIGS. 2-8, an apparatus for producing seed bricks is indicated generally at 200. As shown in FIG. 2, apparatus 200 includes a template 202 that includes a plurality of slots 204 defined therethrough. Slots 204 include vertical slots 206 and horizontal slots 208 that are orthogonal to vertical slots 206.

In this embodiment, template 202 includes six vertical slots 206 and six horizontal slots 208 arranged in a grid that subdivides template 202 into twenty-five square-shaped sections 210 of equal size. In this embodiment, each square-shaped section 210 has dimensions of approximately 156 millimeters (mm) by approximately 156 mm. As template 202 includes a 5×5 grid of square-shaped sections 210, template 202 may also be referred to as a G5 template.

In other embodiments, template 202 may include any suitable number of horizontal and vertical slots 206 and 208, so as to divide template 202 into any suitable number of square-shaped sections 210. For example, in some embodiments, template 202 includes nine vertical slots 206 and nine horizontal slots 208 to divide template 202 into sixty four square-shaped sections 210 (i.e., an 8×8 grid).

As shown in FIG. 2, an adhesive layer 220 is applied to a top surface 222 of template 202. In this embodiment, adhesive layer 220 is a layer of double-sided mounting tape that covers the twenty-five square-shaped sections 210. In other embodiments, adhesive layer 220 may be any suitable adhesive and have any suitable dimensions.

Figure 3:
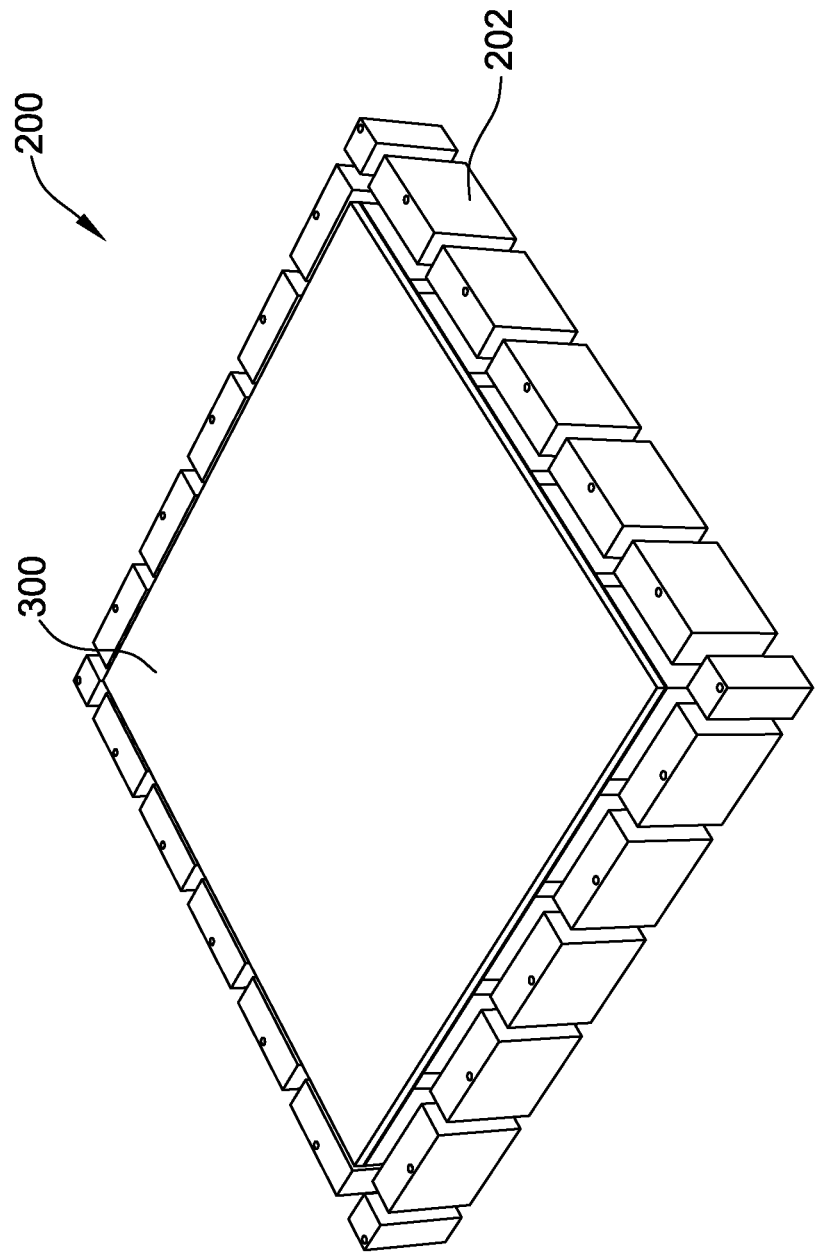
FIG. 3 is a perspective view of the apparatus shown in FIG. 2 including an alignment layer.

Referring back to FIG. 1, an alignment layer is connected in step 104 to the template. FIG. 3 shows an alignment layer 300 connected to template 202. Specifically, adhesive layer 220 facilitates connecting alignment layer 300 to template 202. In this embodiment, similar to adhesive layer 220, alignment layer 300 covers the twenty-five square-shaped sections 210 of template 200.

Referring back to FIG. 1, a plurality of alignment lines are drawn in step 106 on the alignment layer. The alignment lines may suitably be drawn using a suitable writing instrument, such as a pen, pencil, marker, etc., and may be drawn with the aid of a straight edge.

Figure 4:
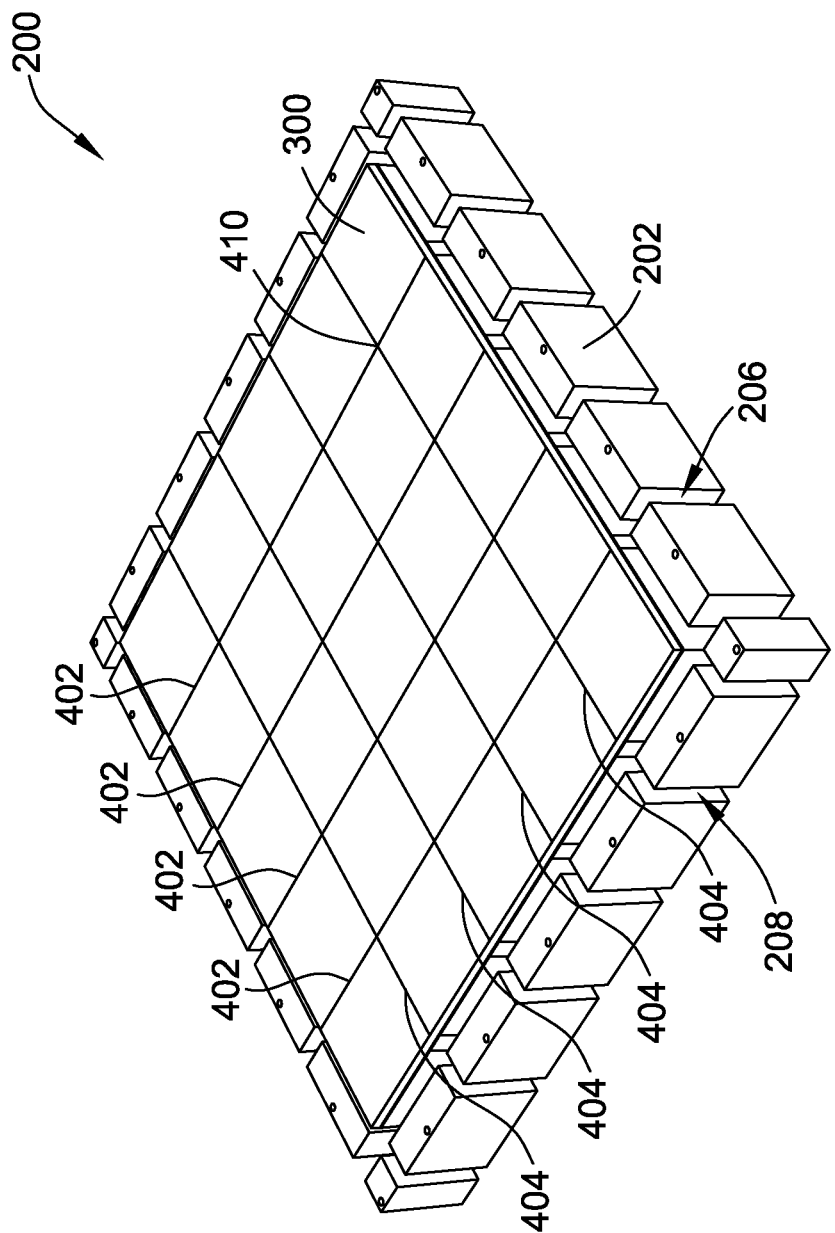
FIG. 4 is a perspective view of the apparatus shown in FIG. 3 including alignment lines drawn on the alignment layer.
Figure 5:
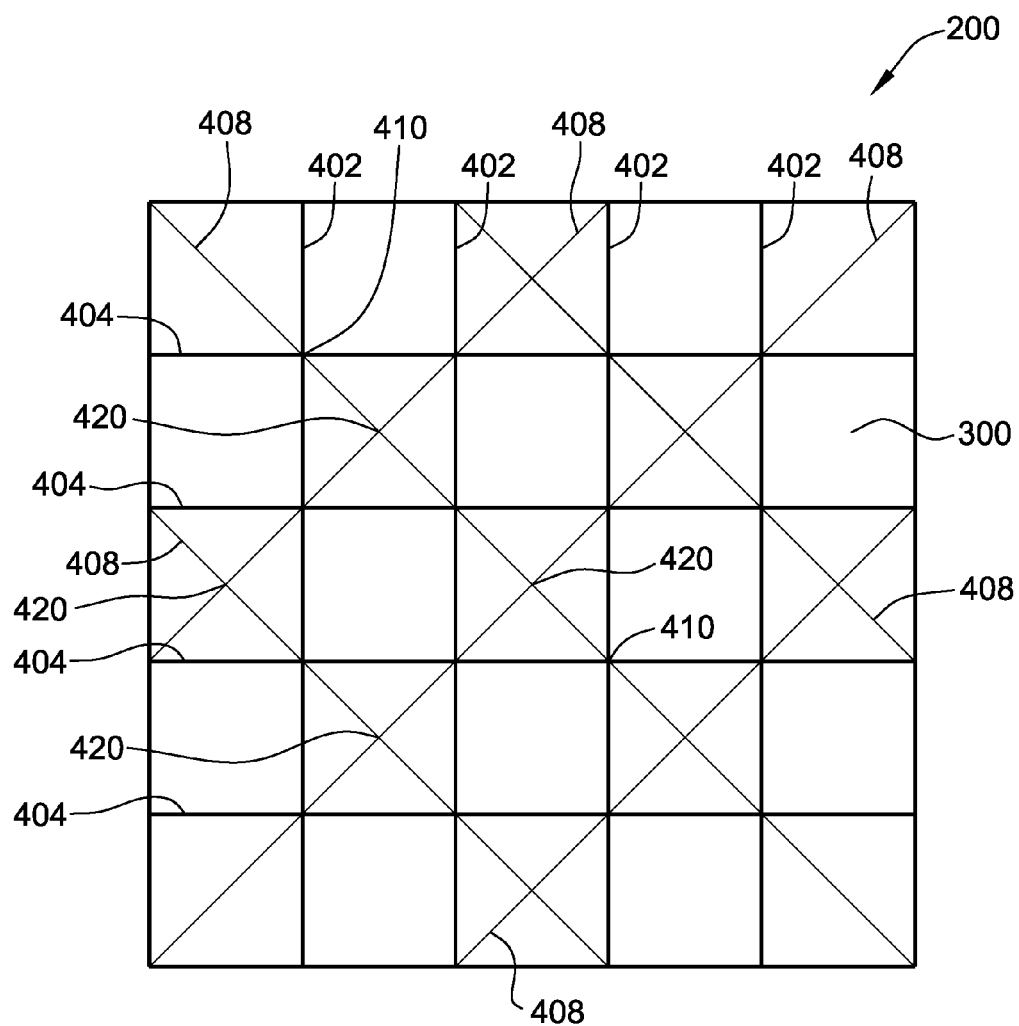
FIG. 5 is a schematic diagram of the apparatus shown in FIG. 4 including diagonal alignment lines.

FIG. 4 shows vertical alignment lines 402 and horizontal alignment lines 404 drawn on alignment layer 300. In this embodiment, alignment layer 300 is a foam layer. In other embodiments, alignment layer 300 may be any suitable material. Vertical and horizontal alignment lines 402 and 404 are substantially aligned with vertical and horizontal slots 206 and 208 of template 202. Once vertical and horizontal alignment lines 402 and 404 are drawn, diagonal alignment lines 408 can be drawn, as shown in FIG. 5. Diagonal alignment lines 408 pass through intersections 410 between vertical and horizontal alignment lines 402 and 404.

An intersection between diagonal alignment lines 408 is referred to as a node 420. In this embodiment, diagonal alignment lines 408 intersect to demarcate a plurality of nodes 420 on alignment layer 300.

Figure 6:
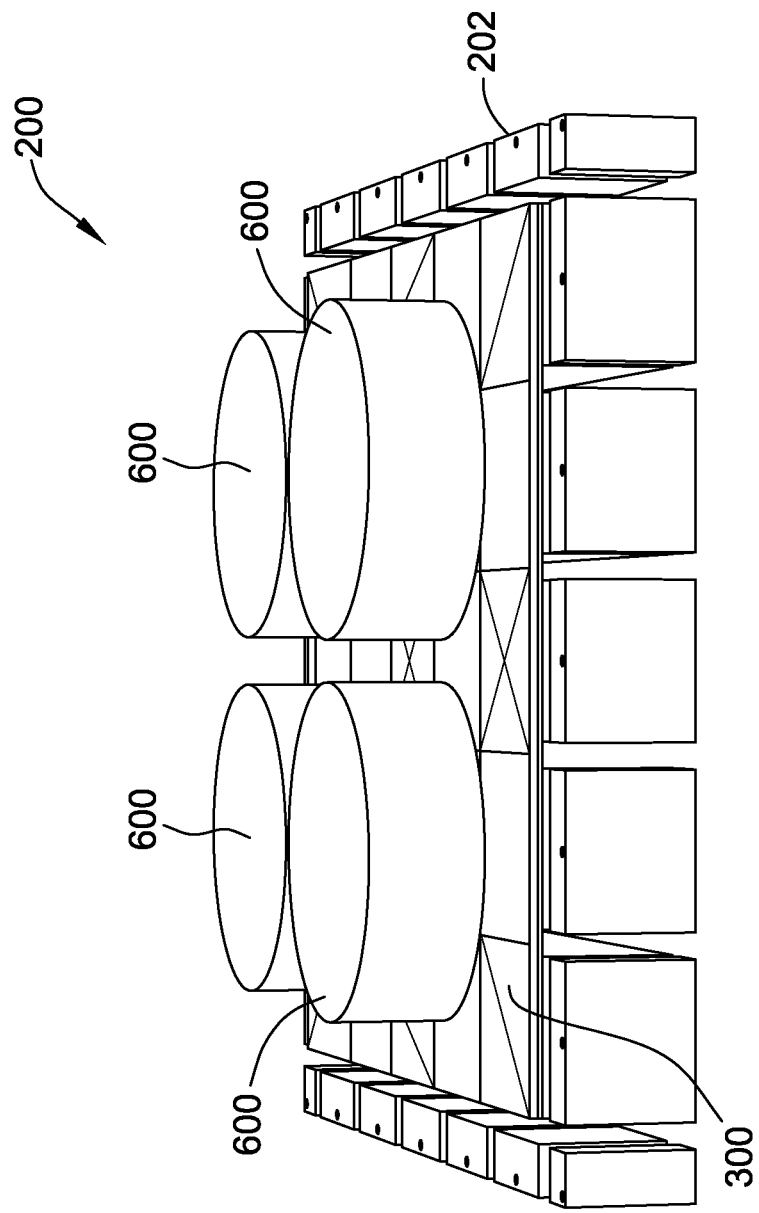
FIG. 6 is a perspective view of the apparatus shown in FIG. 5 including a plurality of cylindrical rods.

Referring back to FIG. 1, cylindrical rods are connected in step 108 to the alignment layer. The cylindrical rods are made of a semiconductor or solar material. In this embodiment, cylindrical rods are made of monocrystalline silicon. FIG. 6 shows four cylindrical rods 600 connected to alignment layer 300, though other numbers of rods may be used. In this embodiment, each cylindrical rod 600 is substantially cylindrical with a diameter of approximately 300 mm and a height of approximately 312 mm or approximately 468 mm. In other embodiments, cylindrical rods 600 may have any suitable dimensions. For example, in some embodiments, each cylindrical rod has a diameter greater than 220 mm.

Figure 7:
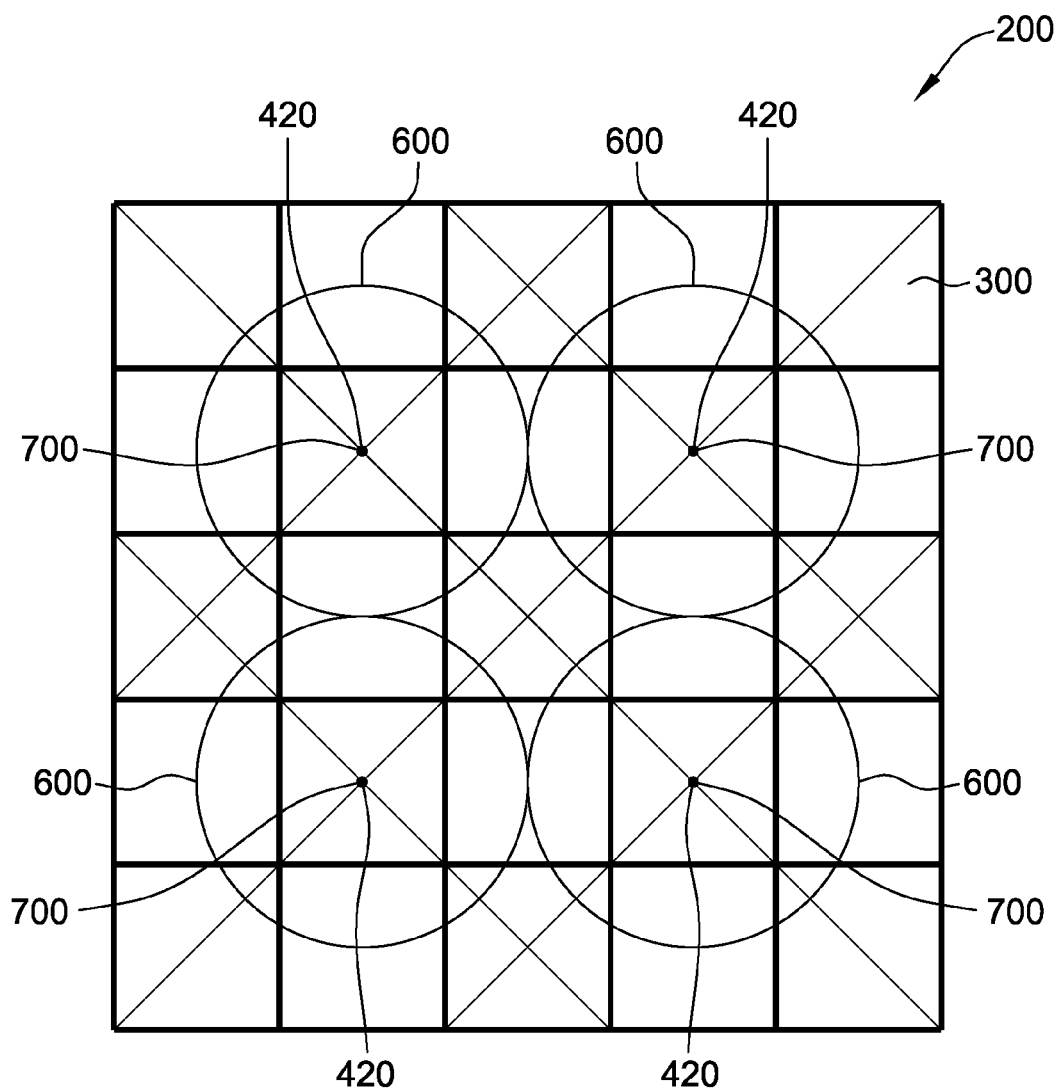
FIG. 7 is a schematic diagram of the apparatus shown in FIG. 6.

As shown in FIG. 7, cylindrical rods 600 are connected to alignment layer 300 such that a center 700 of each cylindrical rod 600 is aligned with a respective node 420, and zero dislocation ("ZD") lines of each cylindrical rod 600 are aligned with diagonal alignment lines 408. In this embodiment, where template 202 is a 5×5 template, four cylindrical rods 600 are connected to alignment layer 300. In other embodiments, a different number of cylindrical rods 600 may be connected to alignment layer 300, depending on the size of template 202. For example, in an embodiment using an 8×8 template 202, up to sixteen cylindrical rods 600 may be connected to alignment layer 300.

Figure 8:
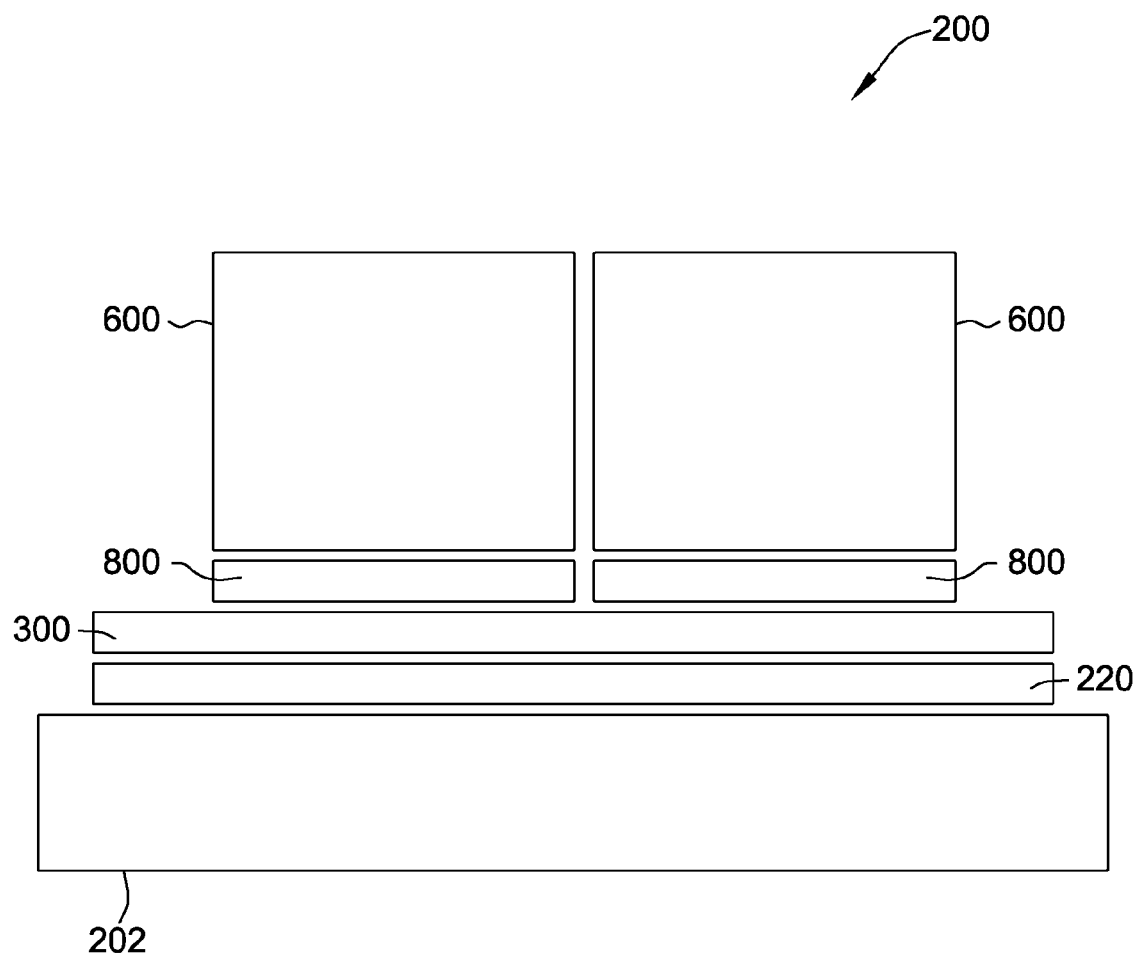
FIG. 8 is a schematic diagram of the apparatus shown in FIG. 6.

As shown in FIG. 8, in this embodiment, each cylindrical rod 600 is connected to alignment layer 300 using double-sided mounting tape 800. More specifically, double-sided mounting tape 800 is a circular piece of tape with approximately the same diameter as cylindrical rod 600.

In this embodiment, the following process is performed to connect each cylindrical rod 600 to alignment layer 300. First, cylindrical rod 600 is placed onto alignment layer 300 without using double-sided mounting tape 800. Cylindrical rod 600 is positioned until the center 700 of cylindrical rod 600 is aligned with an associated node 420. Once cylindrical rod 600 is aligned, at least one or more alignment marks are made on a side of cylindrical rod 600 that corresponds to a crystal 1-1-0 direction. This mark may be a semi-notch, ZD growth line, or other mark that is in the crystal 1-1-0 direction. For example, one or more alignment marks may be drawn on the side of cylindrical rod 600 where diagonal alignment lines 408 intersect cylindrical rod 600. One or more alignment marks may also be drawn on alignment layer 300. Also, other crystal directions may be used in other embodiments.

Cylindrical rod 600 is then removed from alignment layer 300. In this embodiment, double-sided mounting tape 800 includes opposing adhesive surfaces that are each covered by a removable non-stick protective film. One non-stick protective film is peeled away to expose one of the two adhesive surfaces, and double-sided mounting tape 800 is adhered to cylindrical rod 600 using the exposed adhesive surface. Cylindrical rod 600 is again placed onto alignment layer 300, with the adhesive surface facing alignment layer 300 still covered by a non-stick protective film. Using the at least one previously drawn alignment mark, cylindrical rod 600 is again aligned with the associated node 420.

Once aligned, an outline of cylindrical rod 600 (i.e., a circle in this embodiment) is drawn on alignment layer 300. Cylindrical rod 600 is then tilted to expose double-sided mounting tape 800. The remaining non-stick protective film is peeled away to expose the second adhesive surface, and cylindrical rod 600 is carefully lowered back into place such that rod 600 aligns with the drawn outline, ensuring that center 700 is substantially aligned with the associated node 420. This process is repeated to connect each cylindrical rod 600 to alignment layer 300.

As shown in FIG. 8, prior to slicing cylindrical rods 600, apparatus 200 includes alignment layer 300 connected to template 202 using adhesive layer 220. In addition, cylindrical rods 600 are connected to alignment layer 300 using pieces of double-sided mounting tape 800.

Referring back to FIG. 1, the cylindrical rods are sliced in step 110 to produce a plurality of rectangular seed bricks. In this embodiment, cylindrical rods 600 are sliced by a multi-wire web (not shown) that is lowered onto apparatus 200. Specifically, multi-wire web includes a plurality of vertical cutting wires that are aligned with vertical slots 206 in template 202 and a plurality of horizontal cutting wires that are aligned with horizontal slots 208 in template 202. Vertical and horizontal cutting wires may be, for example, wires impregnated with diamond dust to facilitate slicing cylindrical rods 600.

Figure 9:
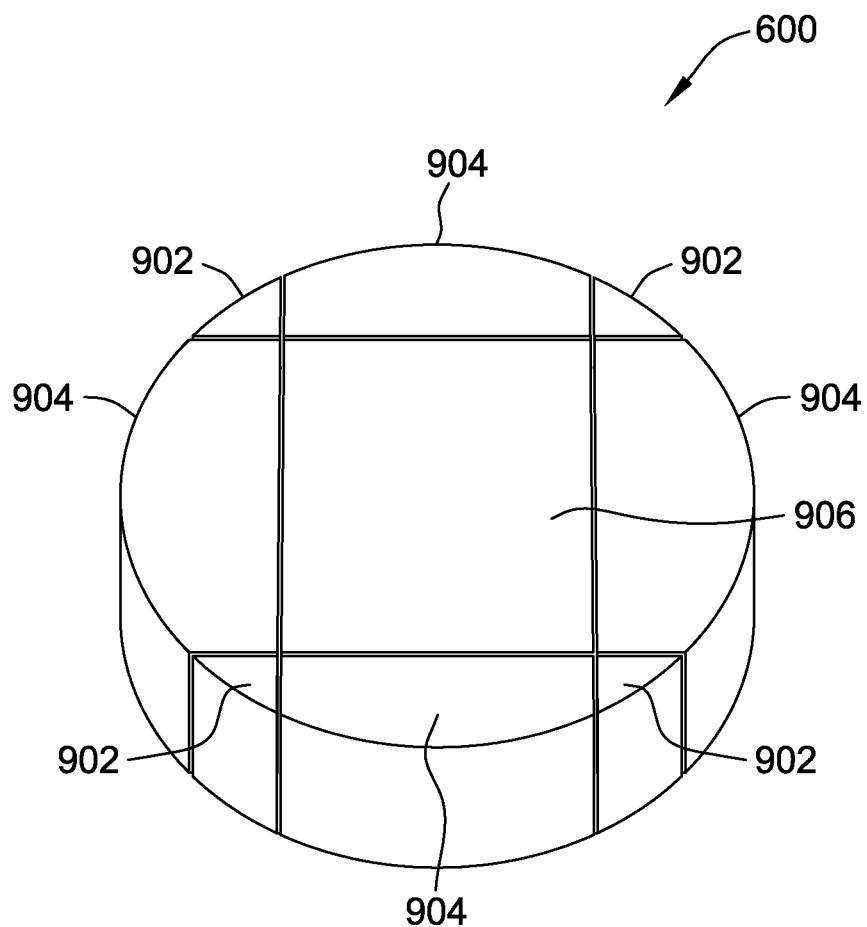
FIG. 9 is a perspective view of a sliced cylindrical rod produced using the apparatus shown in FIG. 6.

In this embodiment, multi-wire web is lowered until vertical and horizontal cutting wires cut through alignment layer 300, such that multi-wire web passes all the way through cylindrical rods 600. As multi-wire web is lowered, the vertical and horizontal cutting wires pass through and slice 110 cylindrical rods 600. FIG. 9 shows a cylindrical rod 600 after slicing 110.

As shown in FIG. 9, cylindrical rod 600 is sliced 110 into nine separate pieces: four corner portions 902, four quarter sections 904, and one rectangular seed brick 906. In this embodiment, each rectangular seed brick 906 has a cross-section of approximately 156 mm by 156 mm (roughly corresponding to dimensions of square-shaped sections 210) and a height of approximately 200 mm. In other embodiments, rectangular seed bricks 906 may have any suitable dimensions.

Figure 10:
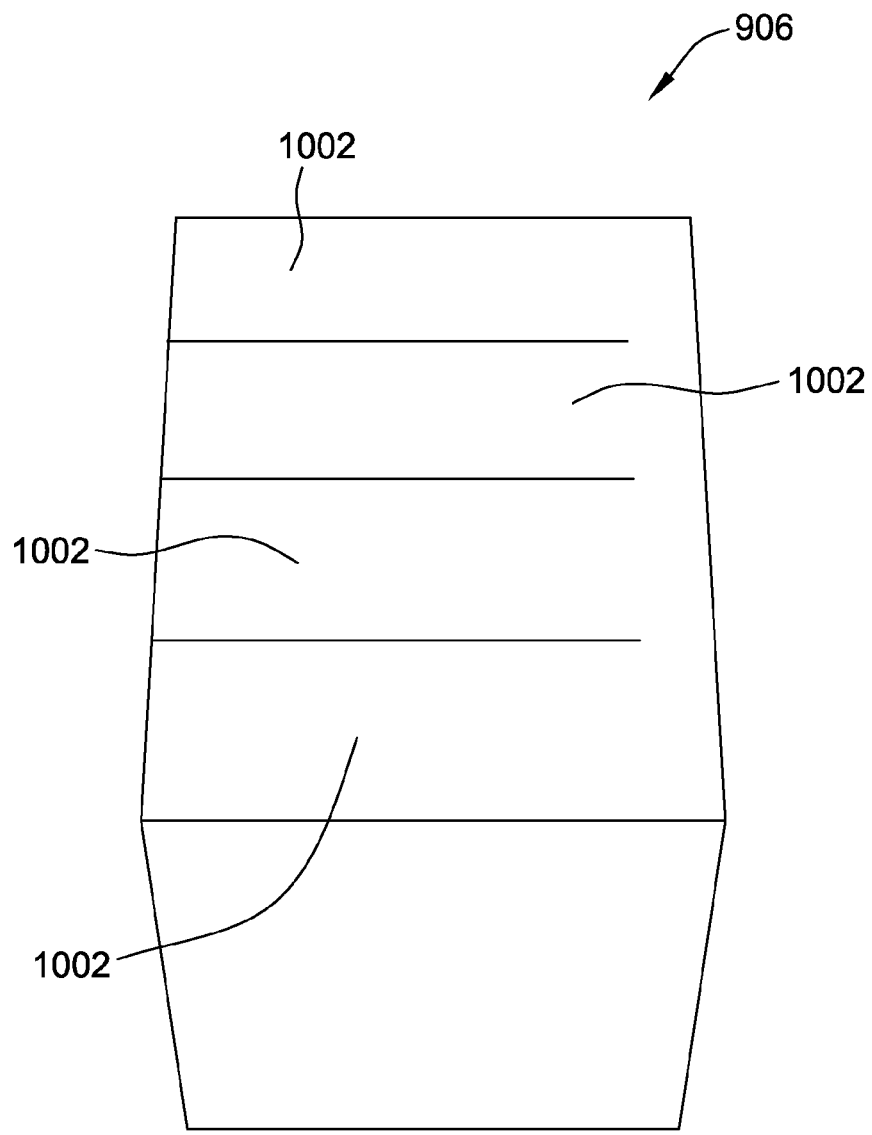
FIG. 10 is a perspective view of a seed brick taken from the sliced cylindrical rod shown in FIG. 9.

Each rectangular seed brick 906 can be marked and cropped into individual seeds 1002, as shown in FIG. 10. For example, in this embodiment, seed brick 906 is marked to be divided into four substantially identical seeds 1002.

In this embodiment, seeds 1002 are each used as a seed crystal in a directional solidification system (DSS) furnace to generate an ingot with a mono-like structure (i.e., a substantially mono-crystalline structure). Quarter sections 904 and corner portions 902 may also be cropped for use as seed crystals in a DSS furnace, as described herein. Semiconductor wafers and/or high-efficiency solar wafers may be produced from the mono-like ingot generated in the DSS furnace.

Figure 11:
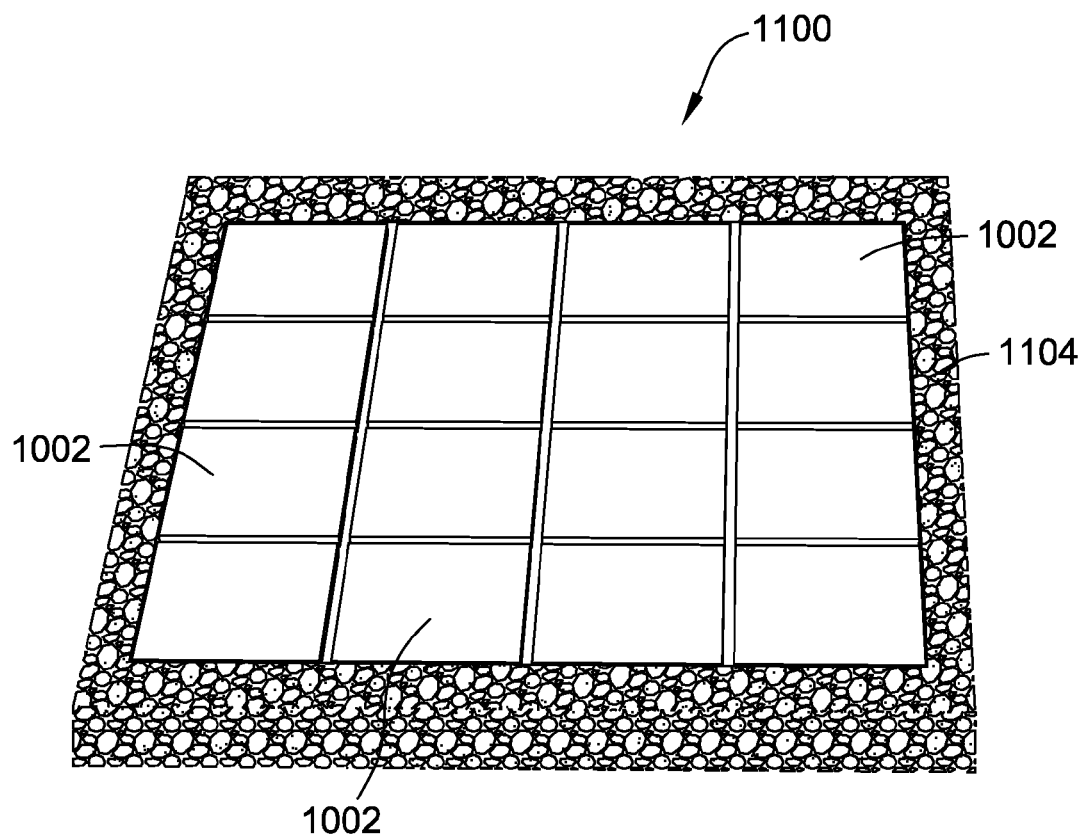
FIG. 11 is a perspective view of a pre-melt arrangement including seeds produced using the method shown in FIG. 1.

FIG. 11 shows a pre-melt arrangement 1100 including a plurality of seeds 1002 arranged in a grid. Arrangement 1100 is created in a crucible of, for example, a DSS furnace (neither shown). In arrangement 1100, seeds 1002 are surrounded by filler material 1104. In this embodiment, filler material 1104 is chipped and/or granular polysilicon. To form mono-like silicon ingots, the crucible is heated to melt seeds 1002 and filler material 1104. Seeds 1002 may also be covered with additional filler material 1104 prior to being melted.

Figure 12:
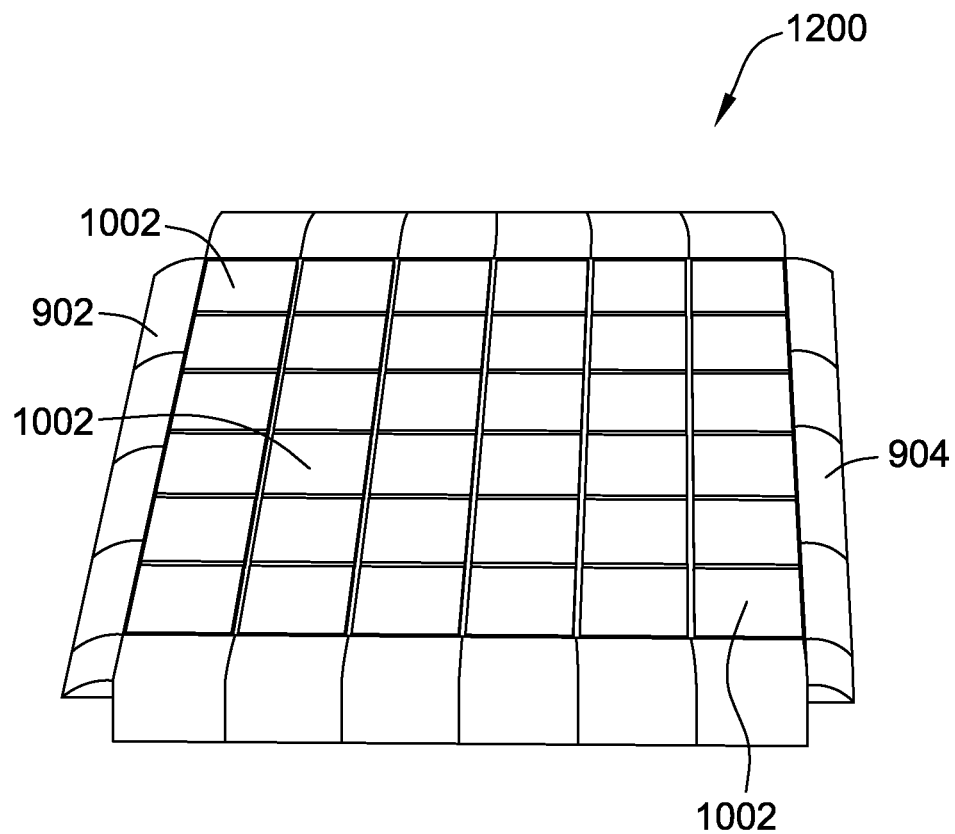
FIG. 12 is a perspective view of an alternative pre-melt arrangement including seeds produced using the method shown in FIG. 1.

FIG. 12 shows an alternative pre-melt arrangement 1200. Similar to arrangement 1100, arrangement 1200 includes a plurality of seeds 1002 arranged in a grid in a crucible (not shown). Instead of filler material 1104 (shown in FIG. 11), seeds 1002 are surrounded by a plurality of corner portions 902 and quarter sections 904 in arrangement 1200. Entire (i.e., whole) corner portions 902 and quarter sections 904 and/or smaller cropped segments of corner portions 902 and quarter sections 904 may be used to surround seeds 1002.

Using corner portions 902 and/or quarter sections 904 in arrangement 1200 instead of filler material 1104 improves the melt when the crucible is heated. Specifically, because corner portions 902 and quarter sections 904 are monocrystalline silicon, corner portions 902 and quarter sections 904 provide more material for producing mono-like silicon ingots than the polysilicon filler material 1104 of arrangement 1100. Arrangement 1200 may also be covered with filler material 1104 prior to being melted.

Embodiments of the methods and systems described herein achieve superior results compared to prior methods and systems. For example, unlike at least some known seed brick production methods, the methods described herein produce a plurality of seed bricks significantly more quickly by simultaneously slicing a plurality of cylindrical rods. Further, unlike at least some known seed brick production methods that utilize band saws, the methods described herein utilize a multi-wire web and associated template, resulting in a uniform surface finish with parallel and square mating surfaces of the produced seed bricks, and reducing kerf loss. Moreover, the rectangular seed bricks, quarter sections, and corner portions produced using the methods described herein may be used as seeds in a crucible of a DSS furnace to produce mono-like silicon ingots. Generally, the embodiments described enable producing seed bricks easier, faster, and/or less expensively than prior systems.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method of producing rectangular seed bricks for use in semiconductor or solar manufacturing, the method comprising:
    connecting an alignment layer to a top surface of a template, the template including a grid of horizontal and vertical slots;
    drawing alignment lines on the alignment layer to demarcate a plurality of nodes;
    connecting cylindrical rods to the alignment layer such that a center of each rod is aligned with a corresponding node; and
    slicing through the rods and the alignment layer with a wire web to produce the rectangular seed bricks.

2. The method of claim 1, wherein drawing alignment lines comprises:
    drawing horizontal and vertical lines that align with the horizontal and vertical slots in the template; and
    drawing diagonal lines, wherein each node is an intersection of two of the diagonal lines.

3. The method of claim 1, wherein slicing through the rods comprises slicing with a wire web that includes horizontal and vertical cutting wires that correspond to the horizontal and vertical slots in the template.

4. The method of claim 1, wherein the alignment layer is made of foam.

5. The method of claim 1, wherein connecting an alignment layer to a top surface of a template comprises connecting the alignment layer to the top surface of the template using a double-sided adhesive film.

6. The method of claim 1, wherein connecting cylindrical rods to the alignment layer comprises connecting the rods to the alignment layer using a double-sided adhesive film.

7. The method of claim 1, wherein connecting cylindrical rods to the alignment layer comprises connecting cylindrical rods each having a diameter greater than 220 millimeters (mm).

8. The method of claim 1, wherein slicing through the rods and the alignment layer with a wire web produces rectangular bricks each having a cross-section of 156 millimeters (mm) by 156 mm.

9. An apparatus for producing rectangular seed bricks for use in semiconductor or solar manufacturing, the apparatus comprising:
    a template including a top surface and a grid of horizontal and vertical slots;
    an alignment layer connected to the top surface of the template, wherein the alignment layer includes alignment lines demarcating a plurality of nodes;
    cylindrical rods made of a semiconductor material and connected to the alignment layer, wherein a center of each rod is aligned with a corresponding node; and
    a wire web configured to slice through the rods and the alignment layer to produce the rectangular seed bricks.

10. The apparatus of claim 9, wherein the alignment lines comprise:
    horizontal and vertical lines that align with the horizontal and vertical slots in the template; and
    diagonal lines, wherein each node is an intersection of two of the diagonal lines.

11. The apparatus of claim 9, wherein the wire web comprises horizontal and vertical cutting wires that correspond to the horizontal and vertical slots in the template.

12. The apparatus of claim 9, wherein the alignment layer is made of foam.

13. The apparatus of claim 9, further comprising a double-sided adhesive film connecting the alignment layer to the top surface of the template.

14. The apparatus of claim 9, wherein each of the rods is connected to the alignment layer using a circular piece of double-sided adhesive film.

15. The apparatus of claim 9, wherein each of the rods has a diameter greater than 220 millimeters (mm).

16. The apparatus of claim 9, wherein the wire web is configured to produce rectangular bricks each having a cross-section of 156 millimeters (mm) by 156 mm.

17. The apparatus of claim 10, wherein the template has six vertical slots and six horizontal slots.

18. The apparatus of claim 10, wherein the template has nine vertical slots and nine horizontal slots.

\* \* \* \* \*

UNITED STATES PATENT AND TRADEMARK OFFICE
CERTIFICATE OF CORRECTION

| | | |
|---|---|---|
| PATENT NO. | : 8,900,972 B2 | Page 1 of 1 |
| APPLICATION NO. | : 13/680873 | |
| DATED | : December 2, 2014 | |
| INVENTOR(S) | : Witte et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 78 days.

Signed and Sealed this
Twentieth Day of October, 2015

Michelle K. Lee
*Director of the United States Patent and Trademark Office*